(12) United States Patent
Okuzono et al.

(10) Patent No.: US 10,910,334 B2
(45) Date of Patent: Feb. 2, 2021

(54) DEVICE FOR INSPECTING A BUMP HEIGHT SURROUNDED BY RESIST, DEVICE FOR PROCESSING A SUBSTRATE, METHOD FOR INSPECTING A BUMP HEIGHT, AND STORAGE MEDIUM

(71) Applicant: EBARA CORPORATION, Tokyo (JP)

(72) Inventors: Takahisa Okuzono, Tokyo (JP); Masaki Tomita, Tokyo (JP); Jumpei Fujikata, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/401,760

(22) Filed: May 2, 2019

(65) Prior Publication Data

US 2019/0348384 A1    Nov. 14, 2019

(30) Foreign Application Priority Data

May 11, 2018  (JP) ................................ 2018-092546

(51) Int. Cl.
| H01L 23/00 | (2006.01) |
| H01L 21/66 | (2006.01) |
| G06T 7/00 | (2017.01) |
| G06K 9/62 | (2006.01) |

(52) U.S. Cl.
CPC ............ *H01L 24/11* (2013.01); *G06K 9/6201* (2013.01); *G06T 7/001* (2013.01); *G06T 7/0006* (2013.01); *H01L 22/26* (2013.01); *G06T 2207/30148* (2013.01); *H01L 2224/117* (2013.01); *H01L 2224/11462* (2013.01)

(58) Field of Classification Search
CPC ..................... H01L 22/12; H01L 22/26; G06T 2207/30148; G06T 2207/30152; G06T 7/0006; G06T 7/001; G06T 7/60; G06T 7/62; G06T 7/00
See application file for complete search history.

(56) References Cited

U.S. PATENT DOCUMENTS

| 6,187,153 B1* | 2/2001 | Drew ..................... C25D 21/12 |
| | | 204/211 |
| 6,271,047 B1* | 8/2001 | Ushio ................... B24B 37/013 |
| | | 257/E21.528 |
| 2001/0024691 A1 | 9/2001 | Kimura et al. |
| 2003/0224596 A1* | 12/2003 | Marxsen ................ H01L 22/26 |
| | | 438/637 |
| 2004/0248329 A1* | 12/2004 | Satake ............... G03F 7/70991 |
| | | 438/16 |
| 2005/0285034 A1* | 12/2005 | Tanaka .................... H01J 37/28 |
| | | 250/310 |
| 2017/0298531 A1* | 10/2017 | Mukaiyama ........... C25D 17/28 |
| 2018/0045947 A1* | 2/2018 | Soetarman ......... G02B 21/0016 |
| 2019/0355688 A1* | 11/2019 | Segev ................ G01B 11/0633 |

FOREIGN PATENT DOCUMENTS

JP    2002-190455 A    7/2002

* cited by examiner

*Primary Examiner* — John P. Dulka
(74) *Attorney, Agent, or Firm* — Rothwell, Figg, Ernst & Manbeck, P.C.

(57) ABSTRACT

A device for inspecting a bump height includes an illumination device, an imaging device, and a control device. The illumination device irradiates a substrate with light. The substrate includes a resist and a bump formed on an opening portion of the resist. The imaging device images a pattern of the resist and the bump. The control device evaluates a height of the bump based on a luminance value of image data of the pattern obtained by the imaging device.

27 Claims, 12 Drawing Sheets

DEVICE FOR INSPECTING A BUMP HEIGHT SURROUNDED BY RESIST, DEVICE FOR PROCESSING A SUBSTRATE, METHOD FOR INSPECTING A BUMP HEIGHT, AND STORAGE MEDIUM

CROSS-REFERENCE TO RELATED APPLICATION

This application is based upon and claims the benefit of priority of the prior Japanese Patent Application No. 2018-092546, filed May 11, 2018, the entire content of which is incorporated herein by reference.

TECHNICAL FIELD

The present invention relates to a device for inspecting a bump height, a device for processing a substrate, a method for inspecting a bump height, and a storage medium that stores a program to cause a computer to execute a method for controlling the device for inspecting a bump height.

BACKGROUND ART

A plating device measures a plating film thickness of a substrate after a plating process and stops the plating process when the plating film thickness is abnormal. For example, a resist is peeled off from the substrate after the plating to measure the plating film thickness with a film thickness measuring machine outside the plating device. In this case, the plating process on the substrate is continued until the abnormality in the plating film thickness is grasped. Thus, a plurality of substrates whose film-thickness distribution is abnormal may be generated.

As an example of disposing the film thickness measuring machine in the plating device, Japanese Unexamined Patent Application Publication No. 2002-190455 (PTL 1) discloses a semiconductor producing apparatus that includes a film-thickness-before-and-after-plating measuring machine that measures a film thickness before and after plating. In this configuration, it is necessary to measure the film thickness before and after the plating with the film-thickness-before-and-after-plating measuring machine, thus possibly causing reduction in throughput.

Japanese Unexamined Patent Application Publication No. 2002-190455 (PTL 1) discloses a first aligner and film thickness measuring unit and a second aligner and film thickness measuring unit. It is necessary to measure the film thickness of a substrate before the plating with the first aligner and film thickness measuring unit and measure the film thickness of the substrate after the plating with the second aligner and film thickness measuring unit, thus possibly causing the reduction in throughput or possibly increasing a device cost to install a film thickness measuring unit for each purpose.

CITATION LIST

Patent Literature

PTL 1: Japanese Unexamined Patent Application Publication No. 2002-190455

SUMMARY OF INVENTION

Technical Problem

An object of the present invention is to solve at least a part of the above-described problems.

Solution to Problem

According to one aspect of the present invention, a device for inspecting a bump height is provided. The device for inspecting a bump height includes an illumination device, an imaging device, and a control device. The illumination device irradiates a substrate with light. The substrate includes a resist and a bump formed on an opening portion of the resist. The imaging device images a pattern of the resist and of the bump. The control device evaluates a height of the bump based on a luminance value of image data of the pattern obtained by the imaging device.

According to one aspect of the present invention, a device for processing a substrate is provided. The device for processing a substrate includes a substrate processing portion, a drying device, a device for inspecting a bump height, and a control device. The substrate processing portion includes one or a plurality of substrate processing units that process a substrate. The drying device dries the substrate after the substrate process. The device for inspecting a bump height is provided to the drying device. The control device controls the substrate processing portion, the drying device, and the device for inspecting a bump height. The device for inspecting a bump height includes an illumination device and an imaging device. The illumination device irradiates the substrate with light. The imaging device images a pattern of a resist and a bump on the substrate. The control device evaluates a height of the bump based on a luminance value of image data of the pattern obtained by the imaging device.

DESCRIPTION OF EMBODIMENTS

Figure 1:
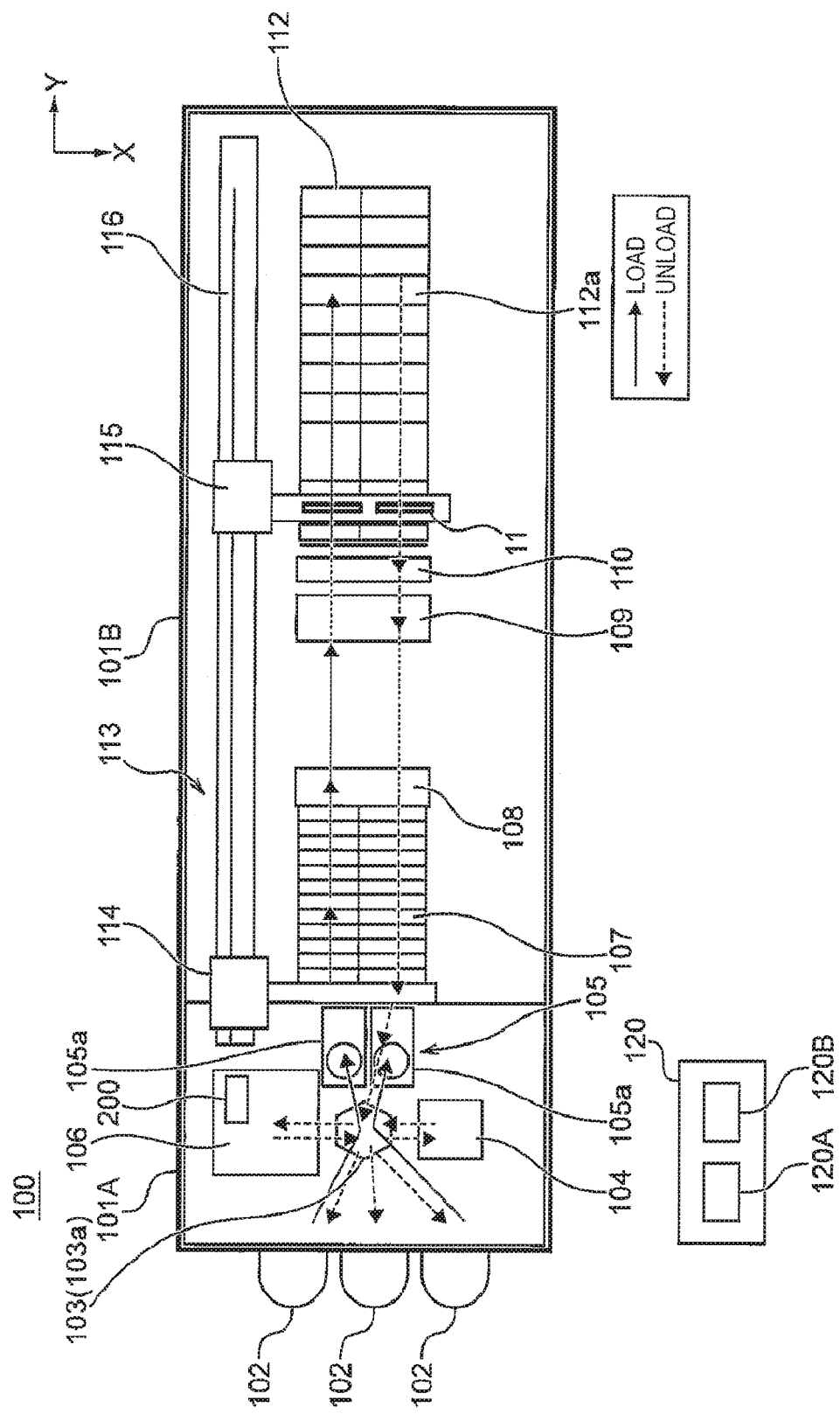
FIG. 1 is an entire layout drawing of a substrate processing device according to one embodiment of the invention.

The following describes embodiments of the present invention with reference to the drawings. In the following respective embodiments, the identical reference numerals are used for the identical or equivalent members, and therefore such components will not be further elaborated here. In this description, expressions such as "up," "down," "left," and "right" are used. They indicate positions and directions on the paper of the exemplary drawings for convenience of explanation and may be different in an actual arrangement, for example, when the device is used. The fact that one member is "positioned on an opposite side of another member with respect to a substrate" means that a member is positioned to face any of substrate surfaces of the substrate and another member is positioned to face a substrate surface on the opposite side of this. In the substrate, when wiring is formed on any one surface, the wiring may be formed on both surfaces.

FIG. 1 is an entire layout drawing of a substrate processing device according to one embodiment of the present invention. In this example, a substrate processing device 100 is an electroplating device. Here, a description will be given using the electroplating device as an example, but the present invention is applicable to any plating device.

The substrate processing device 100 is roughly divided into a loading/unloading unit 101A and a processing unit 101B. The loading/unloading unit 101A loads a substrate W as a to-be-processed product to a substrate holder 11 as a substrate holding member or unloads the substrate W from the substrate holder 11. The processing unit 101B processes the substrate W. The substrate W includes a to-be-processed product having any shape including a circular shape and a polygonal shape. The substrate W includes any to-be-processed product including a semiconductor wafer, a glass substrate, a liquid crystal substrate, and a printed substrate (printed circuit board). The substrate holder 11 includes, for example, first and second holding members (not illustrated). The first holding member and the second holding member sandwich and hold the substrate W. The substrate holder 11 has an opening portion that exposes one surface or both surfaces of the substrate W and includes an electrode (a contact) that contacts an outer peripheral portion of the substrate W supply a current.

The loading/unloading unit 101A includes a plurality of cassette tables 102, an aligner 104, a substrate loading/unloading unit 105, a drying device 106, and a bump height inspection device 200 (as an example of a device for inspecting a bump height) arranged to inspect the substrate W in the drying device 106. The cassette table 102 includes a cassette housing the substrate W. The aligner 104 aligns positions of an orientation flat, a notch, and the like of the substrate W in a predetermined direction. The substrate loading/unloading unit 105 includes one or a plurality of substrate loading/unloading devices 105a configured to attach and remove the substrate W to/from the substrate holder 11. The drying device 106 rotates the substrate W after a plating process with high speed to dry it. At a center of these units, a substrate transport device 103 including a transport robot 103a that conveys the substrate W between these units is arranged.

The processing unit 101B includes a stocker 107 that stores and temporarily places the substrate holder 11, a pre-wet tank 108, a blow tank 109, a rinse tank 110, and a plating processing unit 112. In the pre-wet tank 108, the substrate W before the plating process is immersed in a pure water. In the rinse tank 110, the substrate W after the plating process is cleaned with a cleaning liquid together with the substrate holder 11. In the blow tank 109, liquid draining of the substrate W after the cleaning is performed. The plating processing unit 112 includes a plurality of plating tanks 112a including an overflow tank. Each plating tank 112a internally houses one substrate W and immerses the substrate W in a plating solution, which is internally held, to perform the plating process such as copper plating on a substrate surface. Here, a type of the plating solution is not especially limited, and various plating solutions are used as usage. In this embodiment, as one example, a case where bumps are formed on the surface of the substrate with the plating process will be described. This configuration of the processing unit 101B in the substrate processing device 100 is one example, and another configuration can be employed.

The substrate processing device 100 includes a substrate holder transport device 113 that is positioned lateral to these respective devices and employs any driving system (for example, a linear motor system) to convey the substrate holder 11 between these respective devices. This substrate holder transport device 113 includes a first transporter 114 and a second transporter 115. The first transporter 114 and the second transporter 115 run on a rail 116. The first transporter 114 conveys the substrate holder 11 between the substrate loading/unloading unit 105 and the stocker 107. The second transporter 115 conveys the substrate holder 11 between the stocker 107, the pre-wet tank 108, the blow tank 109, the rinse tank 110, and the plating tank 112a. Only the first transporter 114 may be disposed without the second transporter 115 to cause the first transporter 114 to perform the conveyance between the above-described respective units.

A plating process system including the substrate processing device 100 configured as described above includes a control device 120 configured to control the above-described respective units. The control device 120 includes a memory 120B, which stores various kinds of setting data and various programs, a CPU 120A, which executes the program in the memory 120B, and a device controller (not illustrated), which is formed of a sequencer and the like configured to control the above-described respective units with a control command from the CPU 120A. The CPU 120A controls the respective units in the substrate processing device 100 via and/or without the device controller. The control device 120 can be configured from, for example, a device computer including the CPU 120A and the memory 120B, and the device controller.

A storage medium that constitutes the memory 120B can include any volatile storage medium and/or any non-volatile storage medium. The storage medium can include one or a plurality of any storage media such as a ROM, a RAM, a hard disk, a CD-ROM, a DVD-ROM, and a flexible disk. The memory 120B may be a memory outside the device 100. The program stored in the memory 120B includes, for example, a program to perform conveyance control on the substrate transport device 103, a program to perform control for attaching and removing to/from the substrate holder of the substrate in the substrate loading/unloading unit 105, a program to perform conveyance control on the substrate holder transport device 113, a program to perform control for the plating process in the plating processing unit 112, and a program to control a process by the bump height inspection device 200, which is described later. The control device 120 is configured communicable with an upper controller (not illustrated), which performs integrated control on the substrate processing device 100 and other related devices, by a cable and/or wireless communication, thus ensuring exchange of data with a database included in the upper controller.

Figure 10:
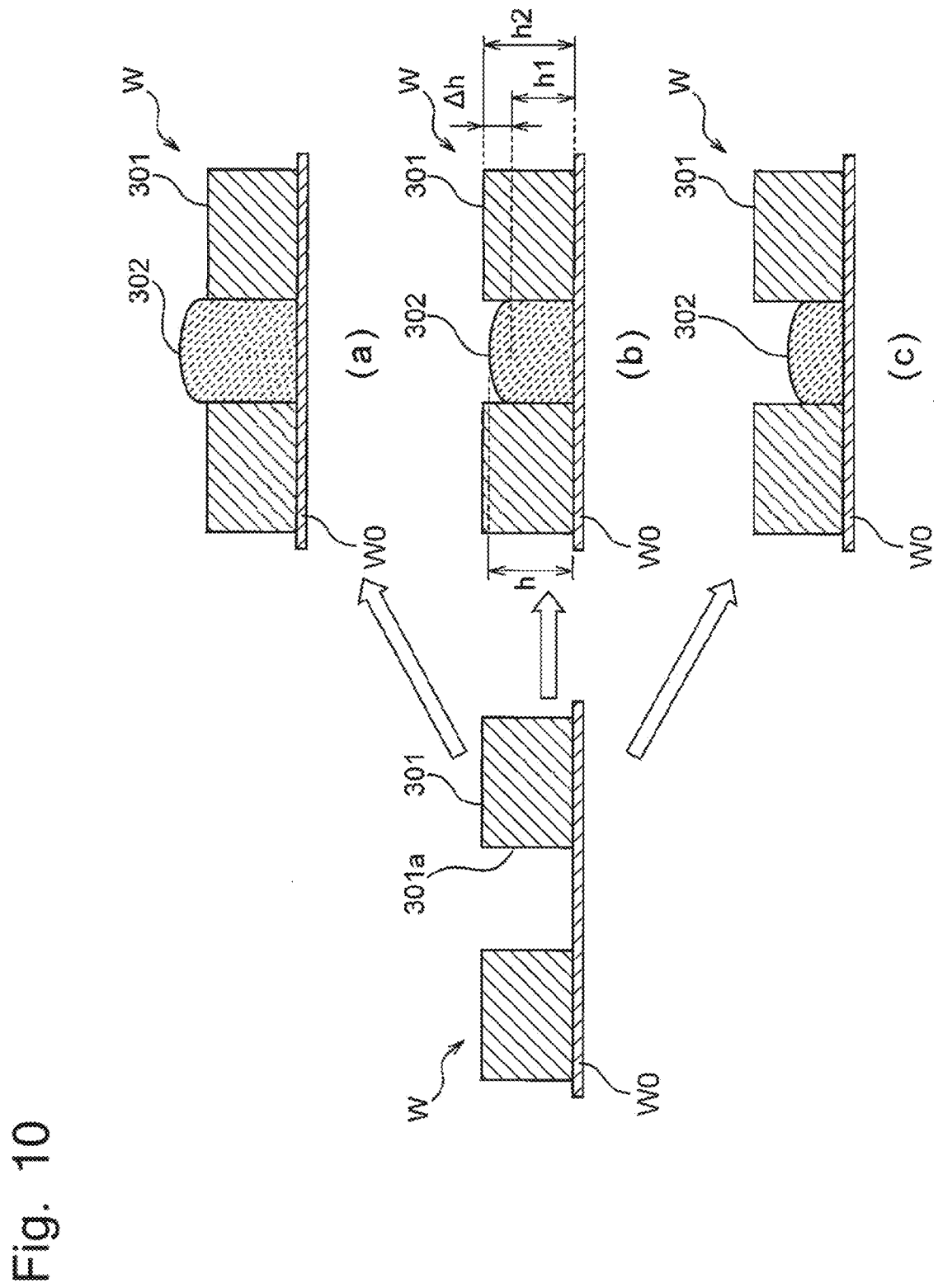
FIG. 10 is an explanatory drawing describing a difference in height of bumps formed on a substrate.

FIG. 10 is an explanatory view describing a difference in height of bumps formed on the substrate. In this drawing, for convenience of explanation, a part of the substrate before a resist layer 301 and a bump 302 are formed is indicated as a substrate main body W0. A seed layer formed on the substrate as a feeding path for plating is omitted. The resist layer 301 is formed on the substrate main body W0. An opening portion 301a is patterned on a part on which the bump 302 is formed. The substrate W in a state having thus patterned resist layer 301 is carried into the substrate processing device 100 to form the bump 302 on the opening portion 301a of the resist layer 301 with an electrolytic plating process. The bump 302, which is a bump electrode, is used, for example, to electrically connect a semiconductor apparatus (chip) or a semiconductor apparatus in a wafer state, which is produced by individualizing the substrate W, to another component such as a printed-circuit substrate and another wafer by flip-chip bonding. In FIG. 10, (a) to (c) each illustrate the substrate W on which the bump 302 having a different height is formed with the plating process. FIG. 10(b) illustrates the substrate W on which the bump 302 in a normal height range is formed. FIG. 10(a) illustrates the substrate W on which the bump 302 having a height exceeding the normal height range (hereinafter simply referred to as "high" in some cases) is formed. FIG. 10(c) illustrates the substrate W on which the bump 302 having a height less than the normal height range (hereinafter simply referred to as "low" in some cases) is formed. The normal height range means that, for example, the bump 302 is in a range from a height low by a predetermined height ($\Delta h$) from a surface of the resist layer 301 to a height equal to or less than the surface of the resist layer 301. Assuming that the height of the bump 302 based on a surface of the substrate main body W0 is defined as h and the normal height range is defined as h1≤h≤h2(h1: a lower-limit value and h2: an upper-limit value), h2 is a film thickness of the resist layer 301, and it can be represented by $\Delta h = h2 - h1$. FIG. 10(a) illustrates a case of h>h2. FIG. 10(b) illustrates a case of h<h1.

Figure 11A:
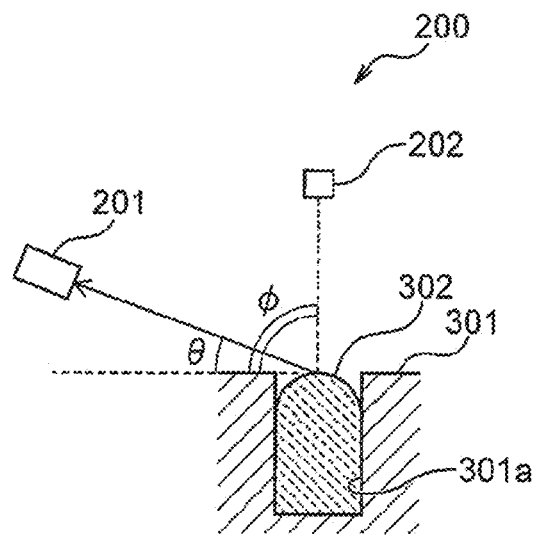
FIG. 11A illustrates a measurement principle of a bump height according to the embodiment.
Figure 11B:
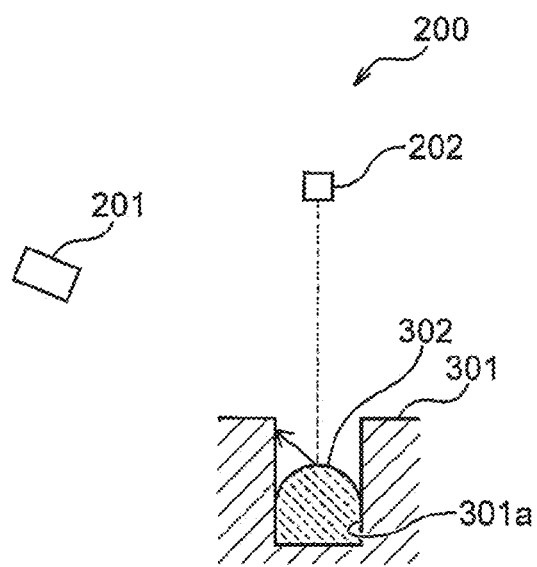
FIG. 11B illustrates a measurement principle of a bump height according to the embodiment.

FIG. 11A and FIG. 11B illustrate a measurement principle of a bump height according to the embodiment. In this embodiment, the bump height inspection device 200 including an imaging device 201 and an illumination device 202 measures the height of the bump 302. In a method illustrated FIG. 11A and FIG. 11B, the illumination device 202 irradiates the bump to be inspected on the substrate with light from a direction perpendicular to the substrate surface. Furthermore, the imaging device 201 images the bump to be inspected on the substrate from a direction oblique to the substrate surface. FIG. 11A and FIG. 11B indicate an irradiation angle with $\varphi$ and an imaging angle with $\theta$. In the example in FIG. 11A, a case (corresponding to FIG. 10(b)) where the height h of the bump 302 is h1 or more and h2 or less is illustrated. In this case, the light from the illumination device 202 is reflected on the bump 302 to enter into the imaging device 201. This causes the imaging device 201 to image the bump 302 with image data having a predetermined luminance value or more. As the example in FIG. 11B, when the height h of the bump 302 is lower than the lower-limit value h1, the light from the illumination device 202 is reflected on the bump 302 and then, cutoff by an inner wall of the opening portion 301a, or only the light having a considerably small strength enters into the imaging device 201. Thus, in the imaging device 201, the bump 302 is not imaged or the bump 302 is imaged with the image data having a considerably small luminance. Accordingly, when the luminance value of the image data imaged by the imaging device 201 is equal to or more than a predetermined value, it can be determined that the height of the bump 302 is equal to or more than a predetermined value. Experientially, it has been known that, when the height of the bump is abnormal, the bump having a low height less than the normal height range and the bump having a high height more than the normal height range are generated in many cases. Accordingly, the abnormality in the bump height can be detected by determining that the bump having the height less than the lower-limit value h1 (less than a first luminance value) is abnormal (determining that the bump having the height equal to or more than the lower-limit value h1 (equal to or more than the first luminance value) is normal). A relationship between the irradiation angle tri at which the bump to be inspected is irradiated with light from the illumination device 202 and the imaging angle $\theta$ at which the light is reflected on the bump to reach the imaging device may be a relationship opposite to that in the method illustrated in FIG. 11A and FIG. 11B. That is, the substrate surface may be irradiated with light from an oblique direction to detect a reflected light from a direction perpendicular to the substrate surface. The irradiation angle at which the bump 302 to be inspected is irradiated with light from the illumination device 202 is preferably different from the imaging angle at which the light is reflected on the bump 302 to reach the imaging device 201.

A pattern of the bump 302 formed on the substrate W and a total area of areas of all the bumps 302 on the substrate W (simply referred to as a bump total area in some cases) have been preliminarily known. On the surface of the resist layer 301, the light from the illumination device 202 is hardly reflected or significantly smaller than a strength of the light reflected on the bump 302. Accordingly, in the case where the imaging device 201 images the pattern of the bump 302 on the substrate W, when an area of a region having a predetermined luminance value (the first luminance value corresponding to the lower-limit value h1) or more in the imaged image data is equal to or more than a predetermined area (a value of the bump total area or a value obtained by applying a predetermined latitude to the value of the bump total area, and when an imaging range is a partial region of the substrate, a value of the bump total area or a value obtained by applying a predetermined latitude to the value of the bump total area in the imaging region), it is determined that the height of the bump on the substrate W is normal, and when the area of the region having the predetermined luminance value or more in the imaged image data is less than the predetermined area, it is determined that the height of the bump on the substrate W is abnormal (bumps whose heights are abnormal are included). To distinguish the bump having the height less than the lower-limit value and the bump having the height equal to or more than the lower-limit value in the normal height range based on the luminance value of the imaged image data, an imaging direction (angle) with respect to the bump of the imaging device 201 is appropriately adjusted. The adjustment of the imaging direction is executed by adjusting an inclination angle and/or a height of the imaging device 201 with an adjustment mechanism 203, which is described later. The bump total area and the luminance value (the lower-limit value and/or the upper-limit value) can be set by, for example, a recipe. Depending on the pattern of the plating, image recognition may be performed on the imaged image data by taking a plating position as a line, thus inspecting a plating height based on a length of the line having the predetermined luminance value (the first luminance value corresponding to the lower-limit value h1) or more. In this case, the plating height can be inspected based on whether the length of the line having the luminance value (the first luminance value corresponding to the lower-limit value h1) or more is a predetermined length or more, or not (or whether the length of the line having the luminance value or more is in a range of the predetermined length or not).

The abnormality in the bump height may be detected by determining that the bump in a range of equal to or more than the lower-limit value h1 and equal to or less than the upper-limit value h2 of the normal height range (equal to or more than the first luminance value and equal to or less than a second luminance value) is normal and determining that the bump having the height out of this range is abnormal. The abnormality in the bump height can be detected by determining that the bump having the height more than the upper-limit value h2 (more than the second luminance value) is abnormal (determining that the bump having the height equal to or less than the upper-limit value h2 (equal to or less than the second luminance value) is normal).

The bump total area may be obtained from the area of the region having the predetermined luminance value (for example, the first luminance value corresponding to the lower-limit value h1) or more by imaging the pattern of the bump 302 on the substrate where the bump height has been known to be normal with the imaging device 201.

Instead of performing the bump height inspection based on the area of the region having the luminance value in the predetermined range or equal to or more than the predetermined value (equal to or less than the predetermined value) as described above, the bump height inspection may be performed with image matching using the image data of the substrate W where the bump height is normal as reference data or teacher data.

Figure 12A:
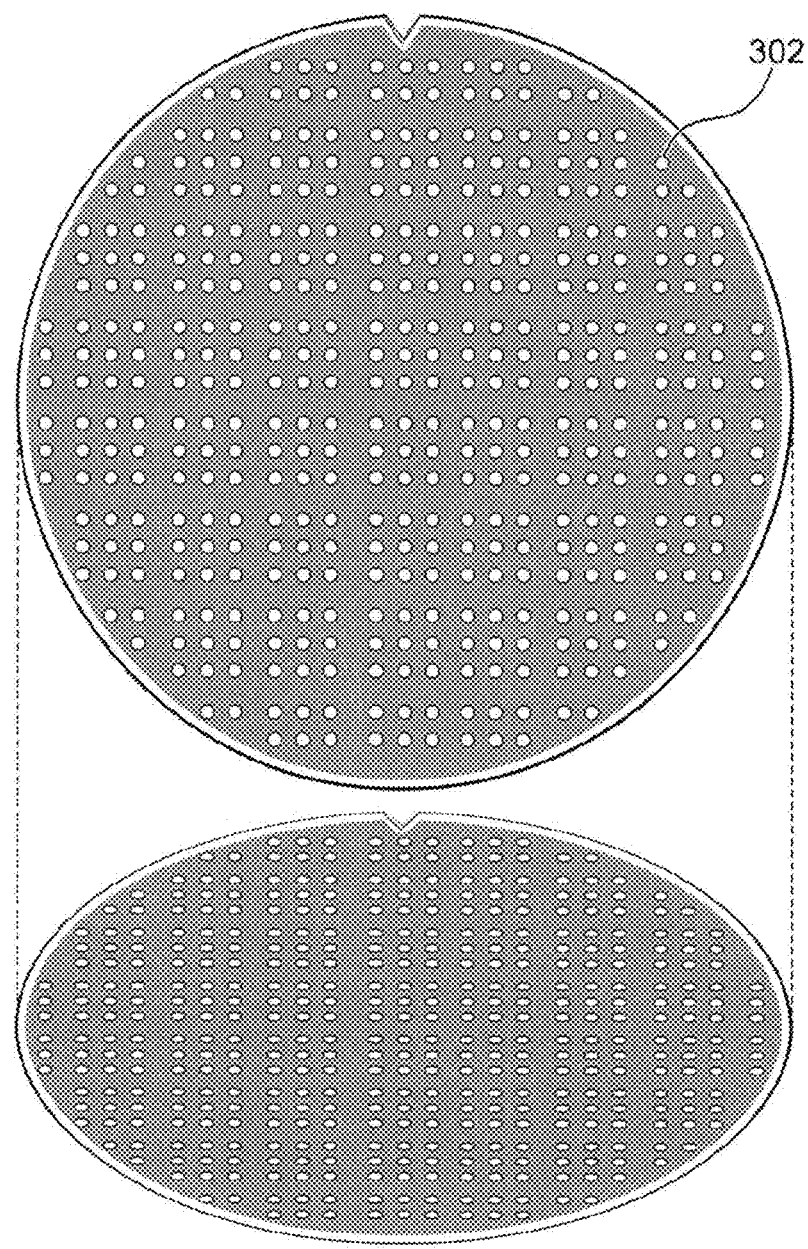
FIG. 12A illustrates an exemplary image obtained by imaging a pattern of bumps on the substrate when the bump height is normal.
Figure 12B:
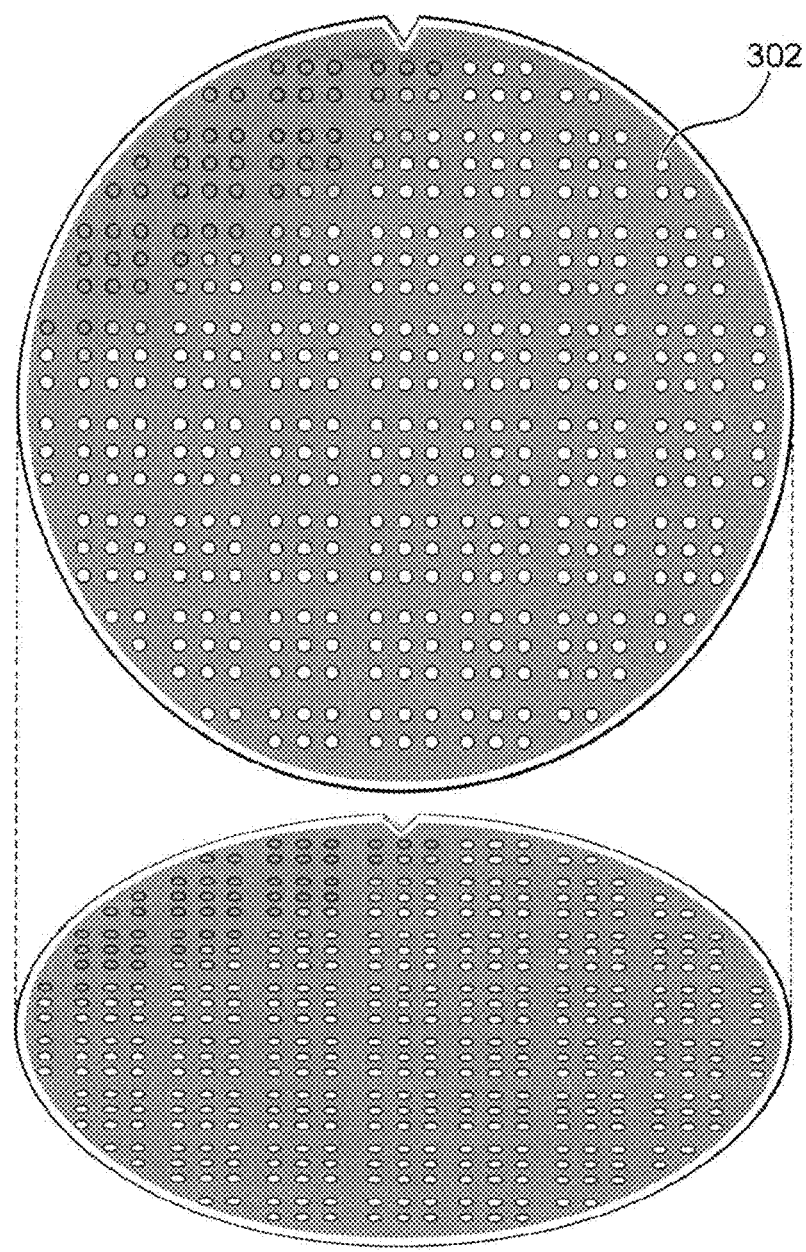
FIG. 12B illustrates an exemplary image obtained by imaging a pattern of bumps on the substrate when the bump height is abnormal.

FIG. 12A illustrates an exemplary image obtained by imaging a pattern of the bumps on the substrate when the bump height is normal. FIG. 12B illustrates an exemplary image obtained by imaging a pattern of the bumps on the substrate when the bump height is abnormal. In FIGS. 12A and 12B, lower drawings illustrate the substrate surfaces viewed from the imaging device when the substrate surfaces are imaged from the oblique direction, and upper drawings illustrate ones obtained by reproducing plan views of the substrates from the imaged image data. In the example in FIG. 12A when the bump height is normal, the pattern of the bumps having the predetermined luminance value or more is observed in the whole region of the substrate W. Meanwhile, in the example in FIG. 12B when the bump height is abnormal, a dark region having a low luminance value (a region where the pattern of the bumps is not imaged or a region of the bumps imaged with the luminance value lower than the luminance value of the normal part) exists in a partial region of the substrate W.

Figure 2:
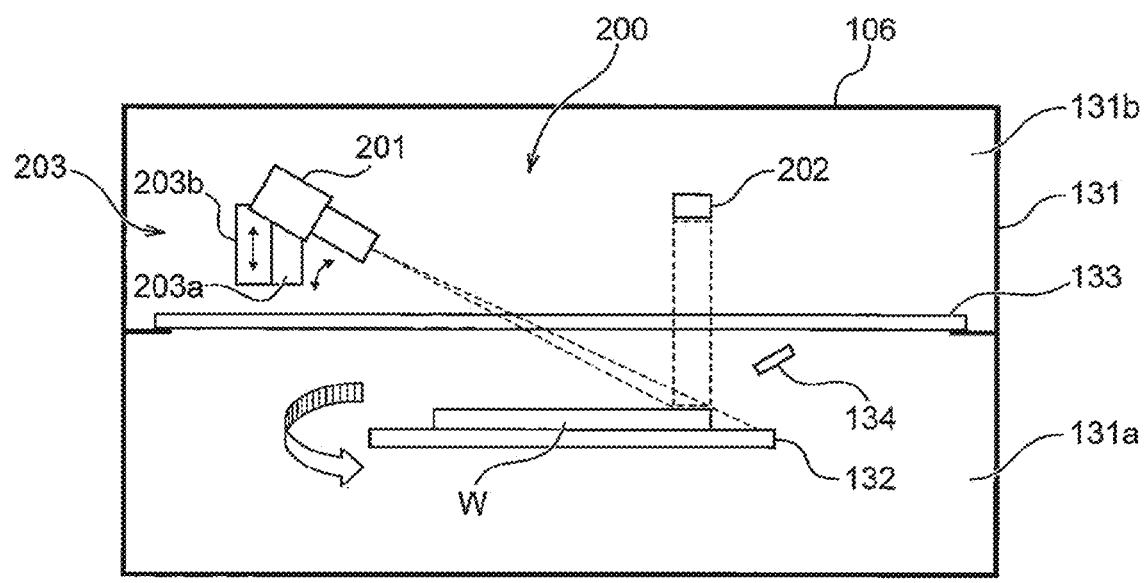
FIG. 2 is a schematic configuration diagram of a bump height inspection device according to one example.

FIG. 2 is a schematic configuration diagram of the bump height inspection device according to one example. The bump height inspection device 200 is arranged on a position configured to inspect the substrate W in the drying device 106. This embodiment shows an example where the drying device 106 is a spin rinse dryer, but the drying device 106 may be any drying device such as a spin dryer having only a drying function.

As illustrated in FIG. 2, the drying device 106 includes a housing 131, a substrate rotation mechanism (as an example of a first rotation mechanism) 132 arranged in the housing 131, and a nozzle 134 arranged above or adjacent to the substrate rotation mechanism 132. The housing 131 internally includes a shutter 133 that divides an internal space of the housing 131 into a first chamber 131a and a second chamber 131b. The shutter 133 is openably/closably configured to shield and release the first chamber 131a and the second chamber 131b. The first chamber 131a and the second chamber 131b are, for example, a lower chamber and an upper chamber respectively. The first chamber 131a and the second chamber 131b constitute, for example, a drying unit and an inspection device storage respectively. The substrate rotation mechanism 132 and the nozzle 134 are arranged in the first chamber 131a as the drying unit. The second chamber 131b may be omitted to arrange the bump height inspection device 200 outside the drying device 106 (outside the housing 131). The bump height inspection device 200 may be arranged configured to inspect the substrate in the drying device 106. For example, the bump height inspection device 200 may be arranged any of inside and outside the drying device 106, and may be mounted or not mounted on the drying device 106.

The substrate rotation mechanism 132 has a placement surface on which the substrate W is placed and held, thus rotating the substrate W. The nozzle 134 supplies the substrate W held onto the substrate rotation mechanism 132 with a cleaning liquid and/or a pure water. In the drying device 106, the substrate W is rotated by the substrate rotation mechanism 132, while the substrate W is cleaned with the cleaning liquid and/or the pure water supplied from the nozzle 134. After stop of the supply of the cleaning liquid and/or the pure water from the nozzle 134, the substrate W is rotated with high speed and dried by the substrate rotation mechanism 132.

The bump height inspection device 200 is arranged in the second chamber 131b as the inspection device storage. The bump height inspection device 200 includes the imaging device 201, the illumination device 202, and the adjustment mechanism 203. The control device 120 executes the program to control the process by the bump height inspection device 200 to function as a control device of the bump height inspection device 200. The imaging device 201 images the pattern on the substrate W held onto the substrate rotation mechanism 132, stores the imaged image data, and/or transfers it to the control device 120. The imaging device 201 can be a color or monochrome camera. The illumination device 202 irradiates the pattern on the substrate W held onto the substrate rotation mechanism 132 with light to allow the imaging device 201 to image the pattern on the substrate W with the luminance value in an appropriate range. The adjustment mechanism 203 is mounted on the imaging device 201 and includes a first adjustment mechanism 203a, which adjusts the inclination angle of the imaging device 201 with respect to the surface of the substrate W, and a second adjustment mechanism 203b, which adjusts the height of the imaging device 201 with respect to the substrate W. The adjustment mechanism 203 adjusts the inclination angle and/or the height of the imaging device 201 with respect to the surface of the substrate W to adjust the imaging direction of the imaging device 201. To ensure the adjustment of a position in a horizontal direction of the imaging device 201 corresponding to dimensions of the substrate W, a horizontal direction adjustment mechanism (not illustrated) may be disposed. When it is not necessary to adjust the imaging direction depending on the type of the substrate, it is not necessary to have an adjustment function of the imaging direction based on setting data of the imaging direction, and the imaging device 201 and/or the illumination device 202 may be fixed on predetermined positions in the plating device to face a predetermined direction.

The bump height inspection device in this embodiment performs the detection with the luminance, thus being susceptible to illumination of a clean room where the plating device is installed, another illumination in the plating device, and the like. Therefore, making an external package of the plating device have a light shielding effect or making a peripheral area of the bump height inspection device have a configuration covered with a douser ensures a more accurate inspection.

The shutter 133 shields/releases between the first chamber 131a and the second chamber 131b. Before or after cleaning and drying the substrate W in the first chamber 131a, the shutter 133 is released to inspect the bump height on the substrate W with the bump height inspection device 200. During cleaning and drying the substrate W, the shutter 133 shields between the first chamber 131a and the second chamber 131b to protect the bump height inspection device 200 from the cleaning liquid and the like and have no influence on the cleaning and drying process.

FIG. 3A to FIG. 3D are explanatory drawings illustrating an effective imaging range (effective imaging area) by the imaging device. The imaging device 201 images an effective imaging range 204 with a desired imaging angle such that the adjustment mechanism 203 adjusts the inclination angle and the height. The imaging range of the imaging device 201 may be wider than the effective imaging range 204 illustrated in FIGS. 3A to 3D, but as described above with reference to FIGS. 11A and 11B, to determine the height of the bump on the substrate W with the luminance value of the imaged image of the bump, it is important to image the bump with a predetermined angle. Thus, the effective imaging range 204 to obtain the image data used for the bump height inspection is preferably limited in a range that can reduce variation in the imaging angle. As the effective imaging range 204 of the imaging device 201, an image in a preliminarily determined range may be cut out from the image imaged by the imaging device 201 to be an analysis object. Alternatively, a boundary of the substrate W may be detected from the image imaged by the imaging device 201 at each imaging to obtain the effective imaging range with calculation to be the analysis object. When an inspection accuracy is in an allowable range, the effective imaging range 204 of the imaging device 201 may be set to cover the whole range of the pattern surface of the substrate W.

Figure 3A:
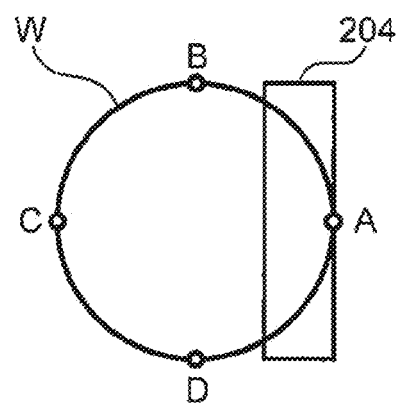
FIG. 3A is an explanatory drawing illustrating an effective imaging range by an imaging device.
Figure 3B:
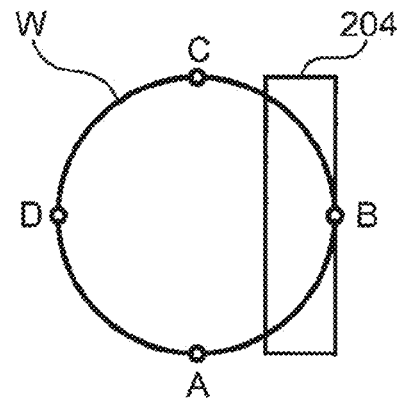
FIG. 3B is an explanatory drawing illustrating an effective imaging range by the imaging device.
Figure 3C:
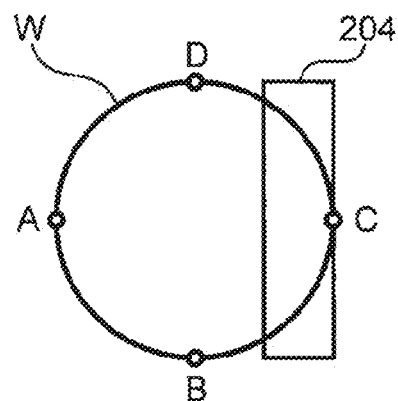
FIG. 3C is an explanatory drawing illustrating an effective imaging range by the imaging device.
Figure 3D:
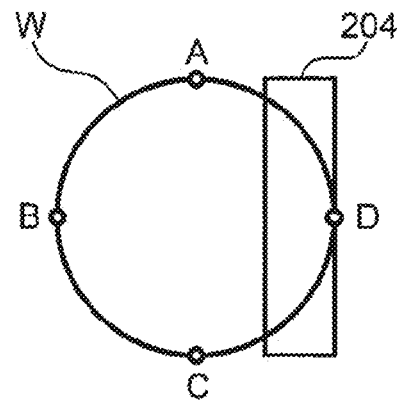
FIG. 3D is an explanatory drawing illustrating an effective imaging range by the imaging device.

In FIG. 3A to FIG. 3D, for convenience of explanation, four points A, B, C, and D are set at equal intervals by 90 degrees on an outer periphery of the substrate W. In FIG. 3A, the effective imaging range 204 is set such that the point A of the substrate W is positioned on a center of an outer side of the effective imaging range 204 of the imaging device 201 or adjacent to the center, the pattern on the substrate W within this effective imaging range 204 is imaged, and the imaged image data is stored and/or forwarded. Next, the substrate W is rotated by 90 degrees by the substrate rotation mechanism 132. In FIG. 3B, the effective imaging range 204 is set such that the point B of the substrate W is positioned on the center of the outer side of the effective imaging range 204 of the imaging device 201 or adjacent to the center, the pattern on the substrate W within this effective imaging range 204 is imaged, and the imaged image data is stored and/or forwarded. Next, the substrate W is further rotated by 90 degrees by the substrate rotation mechanism 132. In FIG. 3C, the effective imaging range 204 is set such that the point C of the substrate W is positioned on the center of the outer side of the effective imaging range 204 of the imaging device 201 or adjacent to the center, the pattern on the substrate W within this effective imaging range 204 is imaged, and the imaged image data is stored and/or forwarded. Next, the substrate W is further rotated by 90 degrees by the substrate rotation mechanism 132. In FIG. 3D, the effective imaging range 204 is set such that the point D of the substrate W is positioned on the center of the outer side of the effective imaging range 204 of the imaging device 201 or adjacent to the center, the pattern on the substrate W within this effective imaging range 204 is imaged, and the imaged image data is stored and/or forwarded. Thus, the pattern on the substrate W is imaged over the whole circumference of an outer peripheral portion of the substrate W. The effective imaging range 204 includes a part other than the substrate W, but the boundary of the substrate W is detected, for example, by detecting an exposed part of a seed layer existing on an outer edge of the substrate W, by image pattern recognition, and the like, to ensure extraction of only the image data on the substrate W. The effective imaging range 204 may expand outside the outer periphery (including the points A to D) of the substrate W.

While in FIG. 3A to FIG. 3D, the case where the substrate is rotated by 90 degrees is illustrated, the substrate may be rotated by an angle less than 90 degrees or more than 90 degrees, or the substrate need not necessarily be rotated at equal intervals.

While in FIG. 3A to FIG. 3D, the case where the substrate W is a circular wafer is exemplified, when the substrate W is polygonal, the substrate can be rotated such that the effective imaging range 204 overlaps every side of the substrate.

Here, the case where the substrate W is rotated by the substrate rotation mechanism 132 is described, but insofar as the substrate W and the imaging device 201 relatively rotate, an imaging device rotation mechanism (not illustrated) as an example of a second rotation mechanism may be disposed to rotate the imaging device 201 around the substrate W with the imaging device rotation mechanism.

The reason that only the pattern on the outer peripheral portion of the substrate W is imaged is as follows. When the electrolytic plating is performed on the substrate W in a state held onto the substrate holder 11, the contact (the electrode) of the substrate holder 11 contacts the outer peripheral portion of the substrate W, and the current is supplied to the whole region (the outer peripheral portion and its inner region) of the substrate W via such contact. Accordingly, when the height of the bump on the substrate W is abnormal, the height of the bump on the outer peripheral portion of the substrate W is abnormal in many cases. Therefore, imaging the pattern of the outer peripheral portion of the substrate W ensures the inspection of the bump height with a sufficient accuracy.

Figure 4:
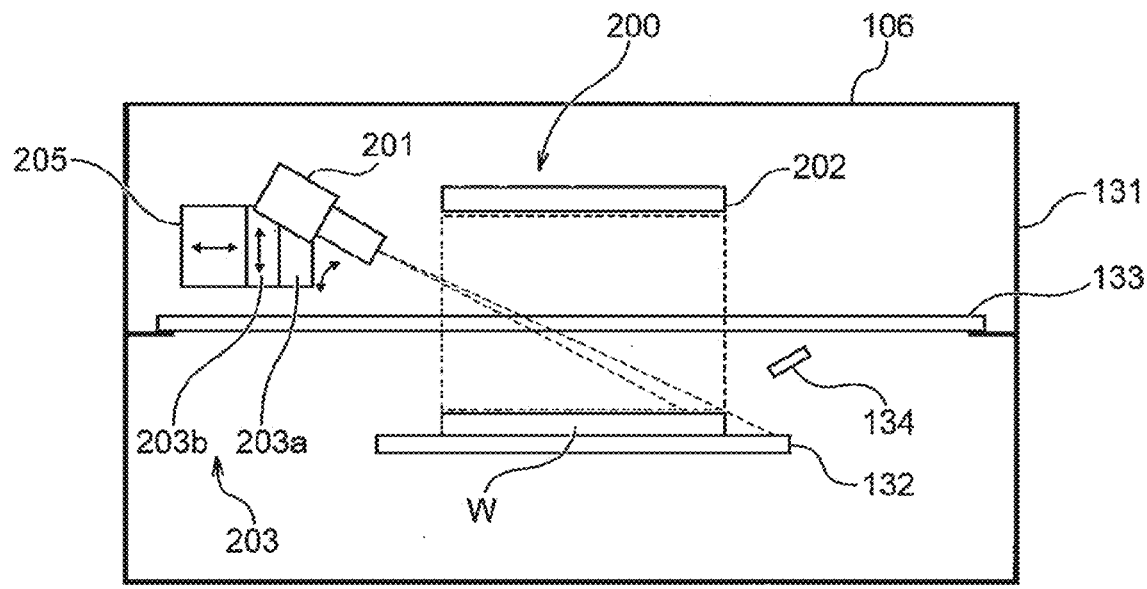
FIG. 4 is a schematic configuration diagram of a bump height inspection device according to another example.
Figure 5:
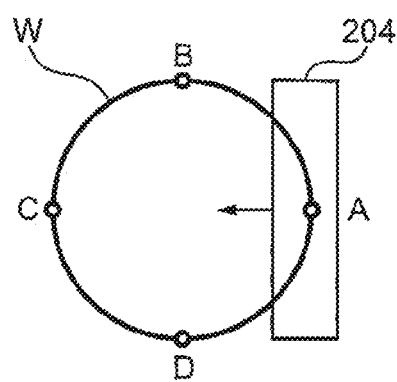
FIG. 5 is an explanatory drawing illustrating scanning of an effective imaging range by the imaging device.

FIG. 4 is a schematic configuration diagram of a bump height inspection device according to another example. FIG. 5 is an explanatory drawing illustrating scanning of the effective imaging range by the imaging device. In this example, a different is that a scanning mechanism 205 that moves the imaging device 201 such that the imaging device 201 images the whole region of the substrate W is disposed. The scanning mechanism 205 is configured to move the imaging device 201 along a radial direction of the substrate W (FIG. 5) (when the substrate W is square, for example, a long side or a short side).

As illustrated in FIG. 5, in the imaging device 201, similarly to FIG. 3A, the inclination angle and the height are adjusted by the adjustment mechanism 203 to set the effective imaging range 204. In FIG. 5, the pattern on the substrate W within the effective imaging range 204 including the point A of the substrate W is imaged to store and/or forward the imaged image data. Afterwards, the imaging device 201 is scanned by a predetermined distance along the radial direction from the point A toward the point C of the substrate W by the scanning mechanism 205 to scan the effective imaging range 204 by the predetermined distance. The pattern on the substrate W of the effective imaging range 204 after the scanning is imaged to store and/or forward the imaged image data. Continuously, the scanning and the imaging of the effective imaging range 204 are repeated to image the whole region of the pattern on the substrate W, thus obtaining the image data of the whole region. In a case of scanning with parallel movement, the imaged area of the substrate within the effective imaging range 204 varies. Thus, detecting the position of the imaging device 201 or the boundary of the substrate W may vary a predetermined area (the value of the bump total area or the value obtained by applying the predetermined latitude to the value of the bump total area) to determine that the height of the bump on the substrate W is normal. When the scanning with the parallel movement is performed, the imaging device does not necessarily use an area sensor and can use a linear sensor. In this case, the irradiation by the illumination device can be a linear illumination perpendicular to a scanning direction.

Figure 6:
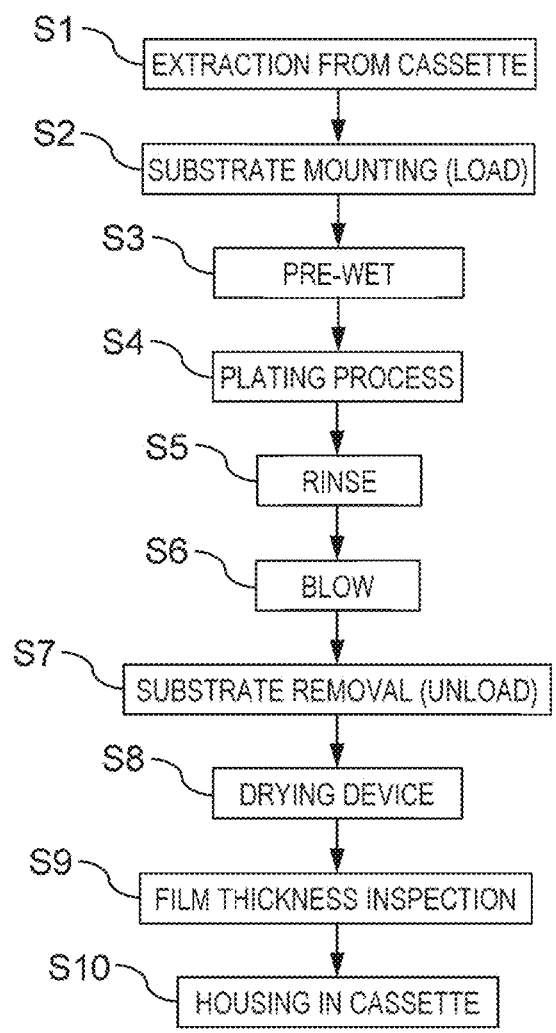
FIG. 6 illustrates an overall flow of a process in the substrate processing device.

FIG. 6 illustrates an overall flow of a process in the substrate processing device. This process is executed by the control device 120. This process may be executed in cooperation with another computer and/or controller.

In Step S1, the substrate W is extracted from the cassette on the cassette table 102 by the transport robot 103a to carry the substrate W into the substrate loading/unloading device 105a of the substrate loading/unloading unit 105. In Step S2, the substrate W is mounted on the substrate holder 11 in the substrate loading/unloading device 105a. In Step S3, the substrate holder 11 carried into the pre-wet tank 108 by the substrate holder transport device 113 is immersed in the pure water. Afterwards, the substrate holder 11 is carried into any plating tank 112a of the plating processing unit 112 by the substrate holder transport device 113, and then, the plating process is performed on the substrate W held onto the substrate holder 11 to form the bumps on the substrate W (Step S4). After the plating process, the substrate holder 11 is carried into the rinse tank 110 by the substrate holder transport device 113 to clean the substrate W with the cleaning liquid together with the substrate holder 11 (Step S5). The substrate holder 11 after the cleaning is carried into the blow tank 109 by the substrate holder transport device 113 to perform liquid draining of the substrate W after the cleaning (Step S6). Afterwards, the substrate holder 11 is carried into the substrate loading/unloading device 105a of the substrate loading/unloading unit 105 by the substrate holder transport device 113 to remove the substrate W from the substrate holder 11 (Step S7). The substrate W removed from the substrate holder 11 is carried into the drying device 106 by the transport robot 103a to clean and dry the substrate W in the drying device 106 (Step S8). In the drying device 106, a bump height inspection process is performed on the substrate W (Step S9). The bump height inspection process (S9) may be executed any of before or after the cleaning and drying process (S8). After the process in the drying device 106, the transport robot 103a returns the substrate W to the cassette (Step S10).

Figure 7:
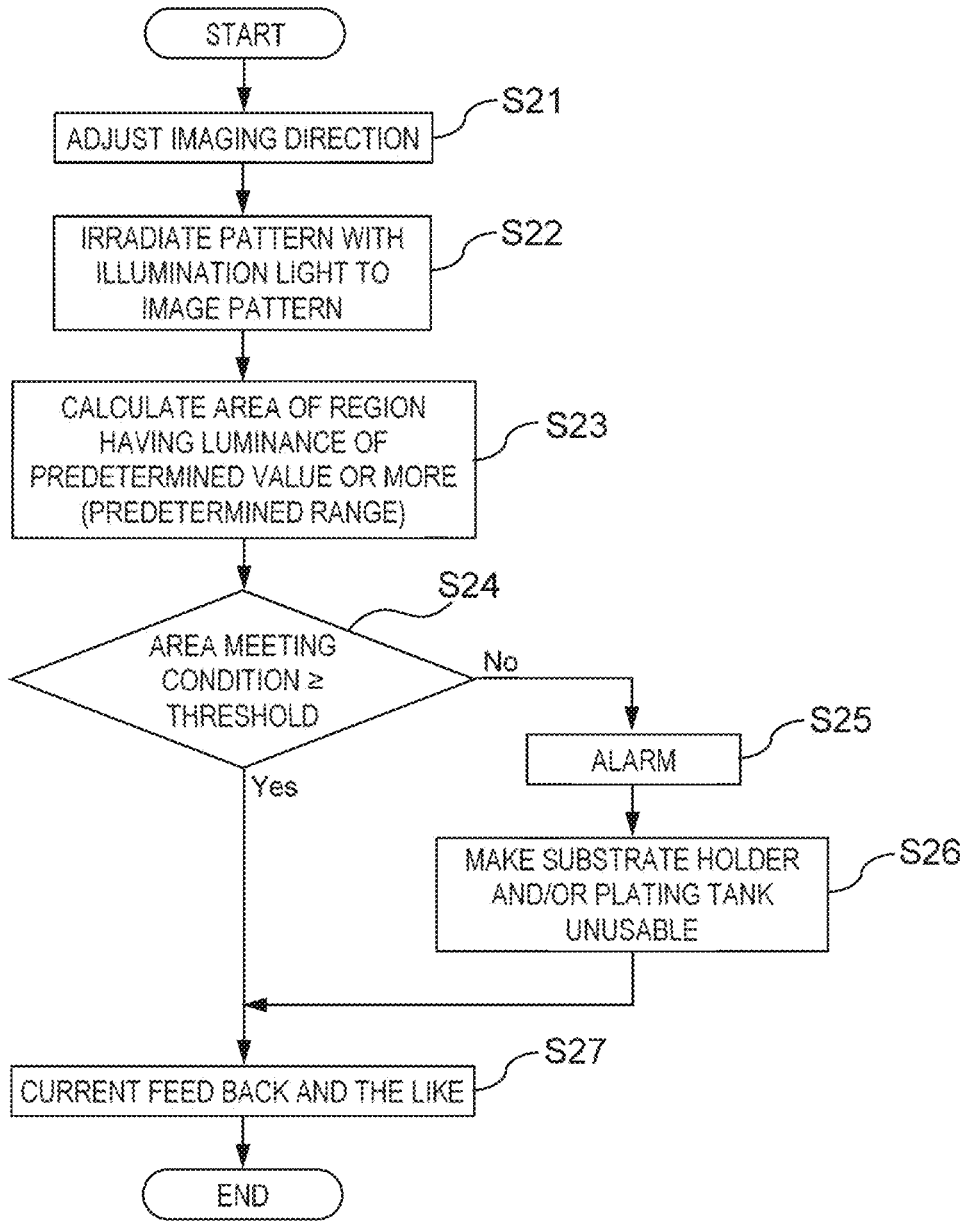
FIG. 7 is a flowchart of a bump height inspection process.

FIG. 7 is a flowchart of the bump height inspection process executed in Step S9. After the substrate W is held onto the substrate rotation mechanism 132 of the drying device 106, the shutter 133 is released to perform the bump height inspection on the substrate W with the bump height inspection device 200. At this time, the bump height inspection may be performed while the imaging device 201 and the illumination device 202 are arranged in the second chamber 131b, alternatively the bump height inspection may be performed after the imaging device 201 and/or the illumination device 202 has descended into the first chamber 131a (or inside the drying device 106). The imaging device 201 can be moved down by the first adjustment mechanism 203a of the adjustment mechanism 203. When the illumination device 202 is moved down, an adjustment mechanism (not illustrated) to move down the illumination device 202 is disposed.

In Step S21, the imaging direction of the imaging device 201 is adjusted by the adjustment mechanism 203 depending on the type of the substrate W to set the effective imaging range 204. The type of the substrate W is determined based on the dimensions of the substrate, the shape of the substrate, a resist film thickness, a resist pattern, the bump height, the bump area, and the like. When the type of the substrate W is changed, the imaging direction appropriate for determining the normal height range based on the luminance value of the bump is also changed. Thus, the imaging direction of the imaging device 201 is adjusted by the adjustment mechanism 203 depending on the type of the substrate W. The setting data of the imaging direction is stored in the memory 120B, for example, as a database that associates the type of the substrate with the imaging direction (for example, a controlled variable of the adjustment mechanism). When the horizontal direction adjustment mechanism is disposed, the position in the horizontal direction of the imaging device 201 may be further adjusted by the horizontal direction adjustment mechanism corresponding to the dimensions of the substrate W as necessary.

After the imaging direction of the imaging device 201 is adjusted and the effective imaging range 204 is set at an initial position of the substrate W, the illumination device 202 irradiates the pattern on the substrate W with light, while the imaging device 201 images the pattern on the substrate W, and then, the control device 120 obtains the imaged image data (Step S22).

Next, the area of the region having the predetermined luminance value or more (the bump having the first luminance value corresponding to the lower-limit value h1 or more) is calculated based on the image data (Step S23). When it is determined that the bump in a predetermined range equal to or more than the lower-limit value h1 and equal to or less than the upper-limit value h2 (equal to or more than the first luminance value and equal to or less than the second luminance value) of the normal height range is normal, the area of the region having the first luminance value or more and the second luminance value or less is calculated.

Then, it is determined whether the calculated area (a sum of the areas of the bumps having a predetermined height h1 (the first luminance value) or more, or a sum of the areas of the bumps having the lower-limit value h1 or more and the upper-limit value h2 or less (equal to or more than the first luminance value and equal to or less than the second luminance value) of the normal height range) is equal to or more than a predetermined area value (threshold) or not (Step S24). The threshold is assumed as a summed value of the areas of the bumps in design or a value obtained by applying the latitude to this summed value, depending on the type of the substrate W and/or the imaging area as the analysis object.

For example, the threshold can be an area value smaller by a predetermined latitude than the area summed value in design. The threshold is determined based on the dimensions of the substrate, the shape of the substrate, the bump area, the imaging area, and the like. When the type of the substrate W is changed, the threshold appropriate for the determination is also changed. Thus, the memory 120B stores a database that associates the type of the substrate and/or the imaging area with the setting data of the threshold.

In Step S24, when it is determined that the calculated area is equal to or more than the threshold, the process transitions to Step S27. In Step S27, a plating current and the like used in the plating process of the substrate W are fed back to the plating process control program and the like of the control device 120, and when the imaging device 201 and/or the illumination device 202 has been moved down inside the first chamber 131a, the imaging device 201 and/or the illumination device 202 is moved up into the second chamber 131b, and then, the shutter 133 is closed to end the bump height inspection process.

Meanwhile, in Step S24, when it is determined that the calculated area is less than the predetermined area, an alarm is generated (Step S25), and the substrate holder 11 and/or the plating tank 112a used in the process of the substrate W is made unused (Step S26). Afterwards, after the process in Step S27 is executed, the bump height inspection process is ended. The plating process of the substrate on which the plating process is currently performed in the substrate holder/the plating tank determined as unused objects is continuously executed, and the substrate holder/the plating tank is made unused after the process of this substrate is ended. When the abnormality in the bump height is continuously generated multiple times, the substrate holder/plating tank may be made unused. After the plating process of all the substrates that currently exist in the plating processing unit 112 is ended, maintenance may be performed by stopping the plating device.

The setting data of the imaging direction and the setting data of the threshold can be stored as the recipes in the memory in the control device 120 of the plating device. However, the databases of such setting data are established in the upper controller to allow the upper controller to instruct the plating device as the recipes for each processed substrate.

When the bump height is inspected based on the length of the line of the bump having the predetermined luminance value (the first luminance value corresponding to the lower-limit value h1) or more in the imaged image data, the length of each line having the luminance value (the first luminance value corresponding to the lower-limit value h1) or more is calculated in Step S23, and then, it is determined whether each line is equal to or more than the predetermined length or not (or whether each line is in the range of the predetermined length or not) in Step S24.

Instead of the process in Steps S23 and S24, the image data of the substrate W whose bump height is normal may be preliminarily prepared as the reference data (the teacher data) to execute the bump height inspection with the image matching using the reference data with respect to the imaged image data.

Figure 8:
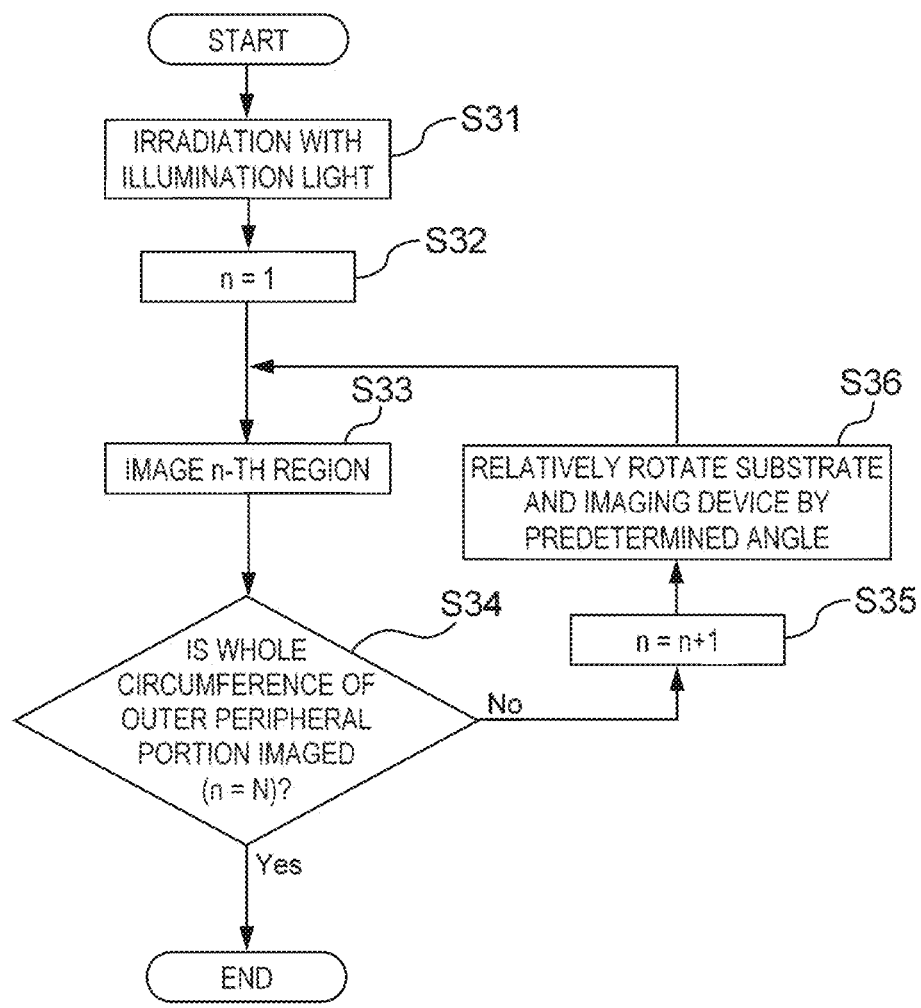
FIG. 8 is a detailed flowchart of an imaging process (S22 in FIG. 7) when the bump height inspection device having the configuration in FIG. 2 is used.

FIG. 8 is a detailed flowchart of an imaging process (S22 in FIG. 7) when the bump height inspection device having the configuration in FIG. 2 is used.

In Step S31, the illumination device 202 irradiates the pattern on the substrate W with light. At this time, the substrate W is assumed to be at the position in FIG. 3A with respect to the illumination device 202, and a rotation position counter n is set at an initial value 1 (Step S32).

In Step S33, the imaging device 201 images the effective imaging range 204 (the pattern on the substrate W within its region) at a rotation position corresponding to a value of a current rotation position counter n, and the control device 120 obtains the imaged image data.

In Step S34, it is determined whether the whole circumference of the outer peripheral portion of the substrate W is imaged or not by determining whether n=N or not. N is the number of rotating movement required for scanning the whole circumference of the substrate W, and N=4 in the example in FIGS. 3A to 3D.

In Step S34, when n is less than N, n is counted up (Step S35), and the process transitions to Step S36. Meanwhile, when n=N in Step S34, the imaging processing flow is ended.

In Step S36, the substrate rotation mechanism 132 rotates the substrate W by a predetermined angle (90 degrees in the example in FIGS. 3A to 3D). When n=2, the substrate W is rotated from the position of the substrate W in FIG. 3A to the position of the substrate W in FIG. 3B. Similarly, when n=3, the substrate W is rotated from the position of the substrate W in FIG. 3B to the position of the substrate W in FIG. 3C. Similarly, when n=4, the substrate W is rotated from the position of the substrate W in FIG. 3C to the position of the substrate W in FIG. 3D.

Figure 9:
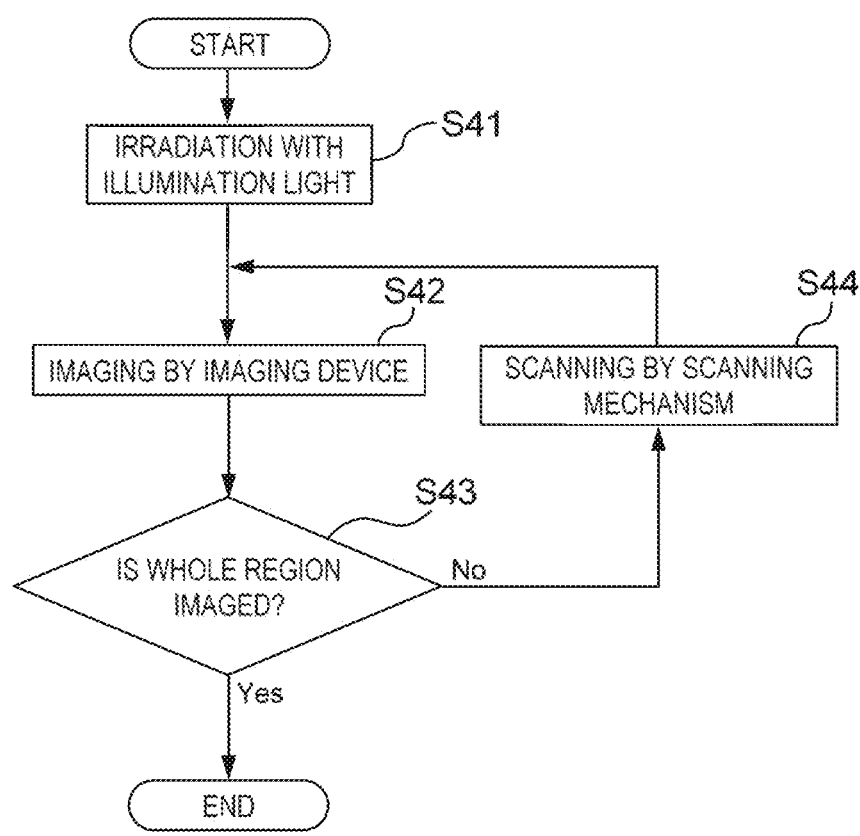
FIG. 9 is a detailed flowchart of an imaging process (S22 in FIG. 7) when the bump height inspection device having the configuration in FIG. 4 is used.

FIG. 9 is a detailed flowchart of an imaging process (S22 in FIG. 7) when the bump height inspection device having the configuration in FIG. 4 is used.

In Step S41, the illumination device 202 irradiates the pattern on the substrate W with light. At this time, the effective imaging range 204 is assumed to be at the initial position illustrated in FIG. 5.

In Step S42, the imaging device 201 images a current effective imaging range 204, and then, the control device 120 obtains the imaged image data.

In Step S43, it is determined whether the whole region of the substrate W is imaged or not.

When it is determined that the whole region of the substrate W is not imaged in Step S43, the scanning mechanism 205 moves the imaging device 201 by a predetermined distance to move the effective imaging range 204 in Step S44, thus repeating the process in Steps S42 and S43. Meanwhile, when it is determined that the whole region of the substrate W is imaged in Step S43, the imaging processing flow is ended.

From the above-described embodiment, at least the following aspects are obtained.

According to a first aspect, a device for inspecting a bump height is provided. The device for inspecting a bump height includes an illumination device, an imaging device, and a control device. The illumination device irradiates a substrate with light. The substrate includes a resist and a bump formed on an opening portion of the resist. The imaging device images a pattern of the resist and the bump. The control device evaluates a height of the bump based on a luminance value of image data of the pattern obtained by the imaging device. The device for inspecting a bump height is configured to be disposed on any device for processing a substrate including a plating device, a polishing device, or a device for processing a substrate including the plating device and the polishing device. The control device of the device for inspecting a bump height may be configured from a function of a control device of the device for processing a substrate when the device for inspecting a bump height is disposed on the device for processing a substrate.

With this aspect, in the image data of the pattern on the substrate imaged by the imaging device, the luminance values of parts of the resist and the bump are different, and the luminance value of the part of the bump differs depending on the height of the bump. Thus, the evaluation and the inspection of the height of the bump are ensured based on the luminance value of the image data. Irradiating the pattern on the substrate with light from the illumination device can adjust a difference in the luminance value in the image data caused by the bump height in an appropriate range. In view of this, the height of the bump on the substrate can be inspected with simple configuration and process.

The height of the bump of the substrate in a state having the resist can be inspected. Thus, it is not necessary to peel off the resist before the inspection, thus ensuring find of the abnormality in the height of the bump for a short period after the bump formation process. Therefore, production of the abnormal substrate using the configuration (for example, the substrate holding member and the plating tank) of the device for processing a substrate that has processed the abnormal substrate can be promptly stopped.

It is not necessary to perform film thickness measurement on the substrate both before and after the bump formation process. Thus, the reduction in throughput can be suppressed. It is not necessary to install a film thickness measurement unit for each purpose. Thus, the device cost can be reduced.

According to a second aspect, in the device for inspecting a bump height of the first aspect, the control device evaluates the height of the bump based on a rate of an area of a region having a luminance value in a predetermined range in the image data.

The height of the bump being in the predetermined range corresponds to the luminance value of the bump in the image data being in the predetermined range, and the area occupied by the bump in the pattern on the substrate has been preliminarily known. Thus, the height of the bump can be evaluated based on whether the area having the luminance value in the predetermined range (the bump having the height in a normal predetermined range) in the pattern on the substrate is in a range of the predetermined area value or not.

According to a third aspect, in the device for inspecting a bump height of the first aspect, the control device evaluates the height of the bump based on a rate of an area of a region having a luminance value at a predetermined value or more in the image data.

It has been experimentally known that, when the abnormality that the height of the bump is high occurs, the abnormality that the height of the bump is low occurs in many cases. Thus, the abnormality that the height of the bump is low may be detected. In this case, a region excluding the region where the height of the bump is low is assumed to be normal. The height of the bump can be evaluated based on whether the area of the region having the luminance value at the predetermined value or more is equal to or more than the predetermined area value or not.

According to a fourth aspect, in the device for inspecting a bump height of the first aspect, the control device sets image data of the pattern when the height of the bump is normal as reference data and evaluates the height of the bump with image matching that compares the image data of the pattern obtained by the imaging device with the reference data.

With this aspect, comparing the imaged image data with the reference data in normal times facilitates the evaluation of the height of the bump. The reference data is, for example, the image data illustrated in FIG. 12A. When the image data of the imaged pattern matches up with the reference data as illustrated in FIG. 12A in a predetermined allowable range, it is determined that the bump height is normal. When the image data of the imaged pattern is, for example, the image data as illustrated in FIG. 12B and does not match up with the reference data in the predetermined allowable range, it is determined that the bump height is abnormal.

According to a fifth aspect, in the device for inspecting a bump height of any of the first to fourth aspects, an adjustment mechanism that adjusts a height and/or an angle with respect to the substrate of the imaging device depending on a type of the substrate is further included.

With this aspect, adjusting the height and/or the angle of the imaging device with respect to the substrate ensures adjustment of the height of the bump configured to be imaged and/or the luminance value of the bump in the image data.

According to a sixth aspect, in the device for inspecting a bump height of any of the first to fifth aspects, the imaging device images the pattern at an outer peripheral portion of the substrate, and the evaluation of the height of the bump is performed based on image data of the pattern of the outer peripheral portion.

Evaluating the bump height based on the image of the pattern of the outer peripheral portion of the substrate ensures reduction in an imaging range to reduce a time needed for the inspection. An irradiation range by the illumination device is also reduced, thus ensuring reduction in size of the illumination device. When the plating process is performed on the substrate held onto the substrate holding member, the electrode contacts the outer peripheral portion of the substrate to apply the current to the whole substrate via the electrode. Thus, when the height of the bump to be plated is abnormal, the height of the bump of the outer peripheral portion of the substrate is abnormal in many cases. Therefore, imaging the pattern of the outer peripheral portion of the substrate allows the abnormality in the height of the bump on the substrate to be accurately detected based on the imaged image data.

According to a seventh aspect, in the device for inspecting a bump height of the sixth aspect, the imaging device and the substrate are relatively rotated by one or more of predetermined angles by a first rotation mechanism (substrate rotation mechanism) that rotates the substrate or a second rotation mechanism (imaging device rotation mechanism) that rotates the imaging device around the substrate, such that the imaging device images the outer peripheral portion of the substrate over a whole circumference.

With this aspect, the outer peripheral portion of the substrate is imaged such that the imaging device and the substrate are relatively rotated by the predetermined angle, thus ensuring reduction in a range imaged once by the imaging device for the inspection.

According to an eighth aspect, in the device for inspecting a bump height according to any of the first to fifth aspects, a scanning mechanism that moves the imaging device such that the imaging device images a whole region of the substrate is further included.

With this aspect, all the bumps on the substrate are imaged to ensure the inspection with higher accuracy.

According to a ninth aspect, a device for processing a substrate is provided. The device for processing a substrate includes a substrate processing portion, a drying device, a device for inspecting a bump height, and a control device. The substrate processing portion includes one or a plurality of substrate processing units that process a substrate. The drying device dries the substrate after the substrate process. The device for inspecting a bump height is provided to the drying device. The control device controls the substrate processing portion, the drying device, and the device for inspecting a bump height. The device for inspecting a bump height includes an illumination device and an imaging device. The illumination device irradiates the substrate with light. The imaging device images a pattern of a resist and a bump on the substrate. The control device evaluates a height of the bump based on a luminance value of image data of the pattern obtained by the imaging device.

The device for processing a substrate can be any device for processing a substrate including the plating device, the polishing device, or the device for processing a substrate including the plating device and the polishing device. The one or plurality of substrate processing units include a plating tank and/or a polishing unit.

With this aspect, in the image data of the pattern on the substrate imaged by the imaging device, the luminance values of parts of the resist and the bump are different, and the luminance value of the part of the bump differs depending on the height of the bump. Thus, the evaluation and the inspection of the height of the bump are ensured based on the luminance value of the image data. Irradiating the pattern on the substrate with light from the illumination device can adjust a difference in the luminance value in the image data caused by the bump height in an appropriate range. In view of this, the height of the bump on the substrate can be inspected with simple configuration and process.

The height of the bump of the substrate in a state having the resist can be inspected in the drying device into which the substrate is carried after the substrate process in the device for processing a substrate. Thus, it is not necessary to peel off the resist before the inspection, thus ensuring the find of the abnormality in the height of the bump for a short period after the substrate process. Therefore, the production of the abnormal substrate using the configuration (for example, the substrate holding member, the plating tank, and the polishing unit) of the device for processing a substrate that has processed the abnormal substrate can be promptly stopped.

It is not necessary to perform the film thickness measurement on the substrate both before and after the substrate process. Thus, the reduction in throughput can be suppressed. The bump height is inspected in the drying device, thus preventing the conveyance of the substrate from being complicated. Accordingly, the reduction in throughput can be suppressed. It is not necessary to install the film thickness measurement unit for each purpose. Thus, the device cost can be reduced.

When the bump height inspection is performed on the substrate after cleaning and drying after the substrate process, the inspection with good accuracy can be performed without being affected by a chemical solution, a residue, and the like attached to the substrate. The bump height inspection is performed on the substrate after drying in the drying device. Thus, it is not necessary to move the substrate after drying to another measurement position to prevent the conveyance of the substrate from being complicated. Accordingly, the reduction in throughput can be suppressed. It is not necessary to install the film thickness measurement unit for each purpose. Thus, the device cost can be reduced.

According to a tenth aspect, in the device for processing a substrate of the ninth aspect, the control device evaluates the height of the bump based on a rate of an area of a region having a luminance value in a predetermined range in the image data.

The height of the bump being in the predetermined range corresponds to the luminance value of the bump in the image data being in the predetermined range, and the area occupied by the bump in the pattern on the substrate has been preliminarily known. Thus, the height of the bump can be evaluated based on whether the area having the luminance value in the predetermined range (the bump having the height in a normal predetermined range) in the pattern on the substrate is in a range of the predetermined area value or not.

According to an eleventh aspect, in the device for processing a substrate of the ninth aspect, the control device evaluates the height of the bump based on a rate of an area of a region having a luminance value at a predetermined value or more in the image data.

It has been experimentally known that, when the abnormality that the height of the bump is high occurs, the abnormality that the height of the bump is low occurs in many cases. Thus, the abnormality that the height of the bump is low may be detected. In this case, a region excluding the region where the height of the bump is low is assumed to be normal. The height of the bump can be evaluated based on whether the area of the region having the luminance value at the predetermined value or more is equal to or more than the predetermined area value or not.

According to a twelfth aspect, in the device for processing a substrate of the ninth aspect, the control device sets image data of the pattern when the height of the bump is normal as reference data and evaluates the height of the bump with image matching that compares the image data of the pattern obtained by the imaging device with the reference data.

With this aspect, comparing the imaged image data with the reference data in normal times facilitates the evaluation of the height of the bump. The reference data is, for example, the image data illustrated in FIG. 12A. When the image data of the imaged pattern matches up with the reference data as illustrated in FIG. 12A in a predetermined allowable range, it is determined that the bump height is normal. When the image data of the imaged pattern is, for example, the image data as illustrated in FIG. 12B and does not match up with the reference data in the predetermined allowable range, it is determined that the bump height is abnormal.

According to a thirteenth aspect, in the device for processing a substrate of any of the ninth to twelfth aspects, an adjustment mechanism that adjusts a height and/or an angle of the imaging device with respect to the substrate corresponding to a type of the substrate is further included.

With this aspect, adjusting the height and/or the angle with respect to the substrate of the imaging device ensures adjustment of the height of the bump configured to be imaged and/or the luminance value of the bump in the image data.

According to a fourteenth aspect, in the device for processing a substrate of any of the ninth to thirteenth aspects, the imaging device images the pattern at an outer peripheral portion of the substrate, and the evaluation of the height of the bump is performed based on image data of the pattern of the outer peripheral portion.

Evaluating the bump height based on the image of the pattern of the outer peripheral portion of the substrate ensures reduction in an imaging range to reduce a time needed for the inspection. An irradiation range by the illumination device is also reduced, thus ensuring reduction in size of the illumination device. When the plating process is performed on the substrate held onto the substrate holding member, the electrode contacts the outer peripheral portion of the substrate to apply the current to the whole substrate via the electrode. Thus, when the height of the bump to be plated is abnormal, the height of the bump of the outer peripheral portion of the substrate is abnormal in many cases. Therefore, imaging the pattern of the outer peripheral portion of the substrate allows the abnormality in the height of the bump on the substrate to be accurately detected based on the imaged image data.

According to a fifteenth aspect, in the device for processing a substrate of the fourteenth aspect, the imaging device and the substrate are relatively rotated by one or more of predetermined angles by a first rotation mechanism (substrate rotation mechanism) that rotates and dries the substrate or a second rotation mechanism (imaging device rotation mechanism) that rotates the imaging device around the substrate, such that the imaging device images the outer peripheral portion of the substrate over a whole circumference.

With this aspect, the outer peripheral portion of the substrate is imaged such that the imaging device and the substrate are relatively rotated by the predetermined angle, thus ensuring reduction in a range imaged by the imaging device for the inspection.

When the substrate rotation mechanism (first rotation mechanism) for substrate drying disposed on the drying device relatively rotates the imaging device and the substrate, using the substrate rotation mechanism for substrate drying that originally exists as a substrate scanning mechanism in imaging can omit the rotation mechanism that rotates the imaging device along the outer peripheral portion of the substrate.

According to a sixteenth aspect, in the device for processing a substrate of any of the ninth to thirteenth aspects, a scanning mechanism that moves the imaging device such that the imaging device images a whole region of the substrate is further included.

With this aspect, all the bumps on the substrate are imaged to ensure the inspection with higher accuracy.

According to a seventeenth aspect, in the device for processing a substrate of any of the ninth to sixteenth aspects, the substrate processing portion includes one or a plurality of plating tanks, the substrate is processed by plating in a state held onto a substrate holding member, and the control device makes the substrate holding member that holds the substrate and/or the plating tank that has performed the plating process unused, when detecting an abnormality in the height of the bump of the substrate as a result of an inspection by the device for inspecting a bump height.

With this aspect, production of the abnormal substrate using the substrate holding member and/or the substrate processing portion (for example, the plating tank and the polishing unit) that has processed the abnormal substrate can be promptly stopped.

According to an eighteenth aspect, a method for inspecting a bump height is provided. The method includes irradiating a substrate including a resist and a bump formed on an opening portion of the resist with light, imaging a pattern of the resist and the bump, and evaluating a height of the bump based on a luminance value of image data of the pattern obtained by the imaging. With this aspect, an operational advantage similar to that of the first aspect is provided.

According to a nineteenth aspect, a storage medium is provided. The storage medium stores a program to cause a computer to execute a method for controlling a device for inspecting a bump height. The program causes the computer to execute: irradiating a substrate including a resist and a bump formed on an opening portion of the resist with light by an illumination device, imaging a pattern of the resist and the bump by an imaging device, and evaluating a height of the bump based on a luminance value of image data of the pattern obtained by the imaging device. With this aspect, the operational advantage similar to that of the first aspect is provided.

The embodiment of the present invention has been described above based on some examples in order to facilitate understanding of the present invention without limiting the present invention. The present invention can be changed or improved without departing from the gist thereof, and of course, the equivalents of the present invention are included in the present invention. It is possible to arbitrarily combine or omit respective components according to claims and description in a range in which at least a part of the above-described problems can be solved, or a range in which at least a part of the effects can be exhibited.

The present application claims priority to Japanese patent application No. 2018-092546 filed on May 11, 2018. The entire disclosure of Japanese patent application No. 2018-092546 filed on May 11, 2018, including specification, claims, drawings and summary is incorporated herein by reference in its entirety.

The entire disclosure of Japanese Unexamined Patent Application Publication No. 2002-190455 (PTL), including specification, claims, drawings and summary is incorporated herein by reference in its entirety.

REFERENCE SIGNS LIST

100 . . . substrate processing device
101A . . . loading/unloading unit
101B . . . processing unit
102 . . . cassette table
103 . . . substrate transport device
103a . . . transport robot
104 . . . aligner
105 . . . substrate loading/unloading unit
105a . . . substrate loading/unloading device
106 . . . drying device
107 . . . stocker
108 . . . pre-wet tank
109 . . . blow tank
110 . . . rinse tank
112 . . . plating processing unit
112a . . . plating tank
113 . . . substrate holder transport device
114 . . . first transporter
115 . . . second transporter
116 . . . rail
120 . . . control device
120A . . . CPU
120B . . . memory
131 . . . housing
131a . . . first chamber
131b . . . second chamber
132 . . . substrate rotation mechanism
133 . . . shutter
134 . . . nozzle
200 . . . bump height inspection device
201 . . . imaging device
202 . . . illumination device
203 . . . adjustment mechanism
203a . . . first adjustment mechanism
203b . . . second adjustment mechanism
204 . . . effective imaging range 205 . . . scanning mechanism
301 . . . resist layer
301a . . . opening portion
302 . . . bump

What is claimed is:

1. A device for inspecting a bump height comprising:
an illumination device that irradiates a substrate with light, the substrate including a resist and a plurality of bumps formed on a plurality of opening portions of the resist;
an imaging device that images a pattern of the resist and the plurality of bumps, a luminance of the resist being different from a luminance of the bump; and
a control device that detects an abnormality of heights of the plurality of bumps based on a luminance value of image data of the pattern obtained by the imaging device.

2. The device for inspecting a bump height according to claim 1, wherein
the control device detects an abnormality of the heights of the plurality of bumps based on a rate of an area of a region having a luminance value in a predetermined range in the image data.

3. The device for inspecting a bump height according to claim 1, wherein
the control device detects an abnormality of the heights of the plurality of bumps based on a rate of an area of a region having a luminance value at a predetermined value or more in the image data.

4. The device for inspecting a bump height according to claim 1, wherein
the control device sets image data of a prior pattern having normal bump heights as reference data and detects an abnormality of the heights of the plurality of bumps with image matching that compares the image data of the pattern obtained by the imaging device with the reference data.

5. The device for inspecting a bump height according to claim 1, further comprising
an adjustment mechanism that adjusts an angle with respect to the substrate of the imaging device depending on a type of the substrate.

6. The device for inspecting a bump height according to claim 1, wherein
the imaging device images the pattern at an outer peripheral portion of the substrate, and
the evaluation of the heights of the plurality of bumps is performed based on only image data of the pattern of the outer peripheral portion.

7. The device for inspecting a bump height according to claim 6, wherein
the imaging device and the substrate are relatively rotated by one or more of predetermined angles by a first rotation mechanism that rotates the substrate or a second rotation mechanism that rotates the imaging device around the substrate, such that the imaging device images the outer peripheral portion of the substrate over a whole circumference.

8. The device for inspecting a bump height according to claim 1, further comprising
a scanning mechanism that moves the imaging device such that the imaging device images a whole region of the substrate.

9. The device for inspecting a bump height according to claim 1, wherein the control device detects an abnormality in response to a determination that the luminance value obtained by the imaging device is outside a predetermined range of luminance values.

10. The device for inspecting a bump height according to claim 1, wherein
an irradiation angle at which the plurality of bumps is irradiated with light from the illumination device is different from an imaging angle at which the light is reflected on the plurality of bumps to reach the imaging device.

11. The device for inspecting a bump height according to claim 1, wherein
the imaging device images the pattern from a direction oblique to a surface of the substrate.

12. A device for processing a substrate comprising:
a substrate processing portion that includes one or a plurality of substrate processing units that process a substrate;
a drying device that dries the substrate after the substrate process;
a device for inspecting a bump height provided to the drying device; and
a control device that controls the substrate processing portion, the drying device, and the device for inspecting a bump height, wherein
the device for inspecting a bump height includes:
an illumination device that irradiates the substrate with light; and
an imaging device that images a pattern of a resist and a plurality of bumps on substrate, a luminance of the resist being different from a luminance of the bumps, and
the control device detects an abnormality of heights of the plurality of bumps based on a luminance value of image data of the pattern obtained by the imaging device.

13. The device for processing a substrate according to claim 12, wherein
the control device detects an abnormality of the heights of the plurality of bumps based on a rate of an area of a region having a luminance value in a predetermined range in the image data.

14. The device for processing a substrate according to claim 12, wherein
the control device detects an abnormality of the heights of the plurality of bumps based on a rate of an area of a region having a luminance value at a predetermined value or more in the image data.

15. The device for processing a substrate according to claim 12, wherein
the control device sets image data of a prior pattern having normal bump heights as reference data and detects an abnormality of the heights of the plurality of bumps with image matching that compares the image data of the pattern obtained by the imaging device with the reference data.

16. The device for processing a substrate according to claim 12 further comprising
an adjustment mechanism that adjusts an angle of the imaging device with respect to the substrate depending on a type of the substrate.

17. The device for processing a substrate according to claim 12, wherein
the imaging device images the pattern at an outer peripheral portion of the substrate, and the evaluation of the heights of the plurality of bumps is performed based on image data of the pattern of the outer peripheral portion.

18. The device for processing a substrate according to claim 17, wherein
the imaging device and the substrate are relatively rotated by one or more of predetermined angles by a first rotation mechanism that rotates and dries the substrate or a second rotation mechanism that rotates the imaging device around the substrate, such that the imaging device images the outer peripheral portion of the substrate over a whole circumference.

19. The device for processing a substrate according to claim 12 further comprising a scanning mechanism that moves the imaging device such that the imaging device images a whole region of the substrate.

20. The device for processing a substrate according to claim 12, wherein
the substrate processing portion includes one or a plurality of plating tanks,
the substrate is processed by plating in a state held onto a substrate holding member, and
the control device makes the substrate holding member that holds the substrate and/or plating tank that has performed the plating process on the substrate unused, when detecting an abnormality in the heights of the plurality of bumps of the substrate as a result of an inspection by the device for inspecting a bump height.

21. The device for inspecting a bump height according to claim 12, wherein
an irradiation angle at which the plurality of bumps is irradiated with light from the illumination device is different from an imaging angle at which the light is reflected on the plurality of bumps to reach the imaging device.

22. The device for inspecting a bump height according to claim 12, wherein
the imaging device images the pattern from a direction oblique to a surface of the substrate.

23. A method for inspecting a bump height comprising:
irradiating a substrate including a resist and a plurality of bumps formed on a plurality of opening portions of the resist with light;
imaging a pattern of the resist and the plurality of bumps, a luminance of the resist being different from a luminance of the plurality of bumps; and
detecting an abnormality of heights of the plurality of bumps based on a luminance value of image data of the pattern obtained by the imaging.

24. A storage medium that stores a program to cause a computer to execute a method for controlling a device for inspecting a bump height, the program causing the computer to execute:
irradiating a substrate including a resist and a plurality of bumps formed on a plurality of opening portions of the resist with light by an illumination device;
imaging a pattern of the resist and the plurality of bumps by an imaging device;
a luminance of the resist being different from a luminance of the plurality of bumps; and
detecting an abnormality of heights of the plurality of bumps based on a luminance value of image data of the pattern obtained by the imaging device.

25. A device for inspecting a bump height comprising:
an illumination device that irradiates a substrate with light, the substrate including a resist and a bump formed on an opening portion of the resist;
an imaging device that images a pattern of the resist and the bump; and
a control device that evaluates a height of the bump based on a luminance value of image data of the pattern obtained by the imaging device,
wherein the imaging device images the pattern at an outer peripheral portion of the substrate, and
the evaluation of the height of the bump is performed based on image data of the pattern of the outer peripheral portion, and
wherein the imaging device and the substrate are relatively rotated by one or more of predetermined angles by a first rotation mechanism that rotates the substrate or a second rotation mechanism that rotates the imaging device around the substrate, such that the imaging device images the outer peripheral portion of the substrate over a whole circumference.

26. A device for processing a substrate comprising:
a substrate processing portion that includes one or a plurality of substrate processing units that process a substrate;
a drying device that dries the substrate after the substrate process;
a device for inspecting a bump height provided to the drying device; and
a control device that controls the substrate processing portion, the drying device, and the device for inspecting a bump height, wherein
the device for inspecting a bump height includes:
are illumination device that irradiates the substrate with light; and
an imaging device that images a pattern of a resist and a bump on the substrate, and
the control device evaluates a height of the bump based on a luminance value of image data of the pattern obtained by the imaging device,
wherein the imaging device images the pattern at an outer peripheral portion of the substrate, and
the evaluation of the height of the bump is performed based on image data of the pattern of the outer peripheral portion, and
wherein the imaging device and the substrate are relatively rotated by one or more of predetermined angles by a first rotation mechanism that rotates and dries the substrate or a second rotation mechanism that rotates the imaging device around the substrate, such that the imaging device images the outer peripheral portion of the substrate over a whole circumference.

27. A device for processing a substrate comprising:
a substrate processing portion that includes one or a plurality of substrate processing units that process a substrate;
a drying device that dries the substrate after the substrate process;
a device for inspecting a bump height provided to the drying device; and
a control device that controls the substrate processing portion, the drying device, and the device for inspecting a bump height, wherein
the device for inspecting a bump height includes:
an illumination device that irradiates the substrate with light; and
an imaging device that images a pattern of a resist and a bump on the substrate, and
the control device evaluates a height of the bump based on a luminance value of image data of the pattern obtained by the imaging device, wherein the substrate processing portion includes one or a plurality of plating tanks, the substrate is processed by plating in a state held onto a substrate holding member, and the control device makes the substrate holding member that holds the substrate and/or the plating tank that has performed the plating process on the substrate unused, when detecting an abnormality in the height of the bump of the substrate as a result of an inspection by the device for inspecting a bump height.

* * * * *